United States Patent
Yamagata

(10) Patent No.: US 7,247,053 B2
(45) Date of Patent: Jul. 24, 2007

(54) HIGH-FREQUENCY APPARATUS HAVING HIGH PERFORMANCE AND CAPABLE OF PREVENTING ENTRY OF INTERFERING WAVE INTO TERMINAL

(75) Inventor: Yuichiro Yamagata, Fukushima-ken (JP)

(73) Assignee: ALPS Electric Co., Ltd., Ota-ku, Tokyo (JP)

(*) Notice: Subject to any disclaimer, the term of this patent is extended or adjusted under 35 U.S.C. 154(b) by 0 days.

(21) Appl. No.: 11/521,774

(22) Filed: Sep. 14, 2006

(65) Prior Publication Data
US 2007/0099505 A1 May 3, 2007

(30) Foreign Application Priority Data
Nov. 1, 2005 (JP) .............................. 2005-318387

(51) Int. Cl.
*H01R 13/648* (2006.01)
(52) U.S. Cl. ......................................... 439/607; 439/95
(58) Field of Classification Search .................. 439/95, 439/96, 607, 609, 101, 108; 725/127
See application file for complete search history.

(56) References Cited

U.S. PATENT DOCUMENTS

| | | | | |
|---|---|---|---|---|
| 4,012,672 A | * | 3/1977 | Douglass et al. | ........... 361/829 |
| 6,276,966 B1 | * | 8/2001 | Yamoto et al. | ............. 439/607 |
| 6,780,055 B2 | * | 8/2004 | Shinoura et al. | ............ 439/607 |
| 2003/0177505 A1 | | 9/2003 | Matsushima et al. | |

FOREIGN PATENT DOCUMENTS

JP 2908967 4/1999

* cited by examiner

*Primary Examiner*—Hae Moon Hyeon
(74) *Attorney, Agent, or Firm*—BeyerWeaver LLP

(57) ABSTRACT

A high-frequency apparatus includes a shielding plate that electrically shields any of a plurality of terminals protruding from a frame. An exposed portion of the terminal disposed between the frame and a motherboard is shielded by the shielding plate. Therefore, especially, a terminal that is likely to be adversely affected by an external wave can be electrically shielded by the shielding plate, the entry of an interfering wave into the terminal can be prevented, and high performance can be achieved.

4 Claims, 4 Drawing Sheets

HIGH-FREQUENCY APPARATUS HAVING HIGH PERFORMANCE AND CAPABLE OF PREVENTING ENTRY OF INTERFERING WAVE INTO TERMINAL

CROSS-REFERENCE TO RELATED APPLICATION

This application claims priority from Japanese Patent Application JP2005-318387 filed on Nov. 1, 2005, which is hereby incorporated by reference in its entirety for all purposes.

BACKGROUND OF THE INVENTION

1. Field of the Invention

The present invention relates to a high-frequency apparatus that is suitably used in, for example, a digital broadcasting receiving tuner for a CATV.

2. Description of the Related Art

FIGS. 7 and 8 are a side view and a bottom view, respectively, showing the configuration of a high-frequency apparatus disclosed in Japanese Patent No. 2908967. In the high-frequency apparatus, a frame 51 is formed of a metal plate and is shaped like an open square. Two covers 52 are attached to the frame 51 so as to respectively cover two opposing open faces of the frame 51.

Although not shown, a circuit board having electronic components is placed in the frame 51. A plurality of terminals 53 are arranged in line on the circuit board. The terminals 53 protrude downward from a bottom wall 51a of the frame 51. Two legs 51b also protrude from the frame 51 in the same direction as that of the terminals 53.

As shown in FIG. 7, the high-frequency apparatus having this configuration is mounted on the motherboard 54 by fitting the legs 51b and the terminals 53 in a hole (not shown) of a motherboard 54, and soldering the legs 51b and the terminals 53 to a conductive pattern (not shown) of the motherboard 54 while there is a space between the motherboard 54 and the bottom wall 51a through which the terminals 53 extend.

However, when the above-described high-frequency apparatus is mounted on the motherboard 54, the terminals 53 are exposed from the space between the motherboard 54 and the bottom wall 51a, and an interfering wave enters the terminals 53 through the open space. In particular, an interfering wave enters an antenna terminal serving as one of the terminals 53, and this reduces the performance of the apparatus.

SUMMARY OF THE INVENTION

The present invention has been made in view of these circumstances of the related art, and an object of the invention is to provide a high-frequency apparatus having high performance and capable of preventing the entry of an interfering wave into terminals.

In order to achieve the above object, a high-frequency apparatus according to an aspect of the present invention includes a frame formed of a metal plate; a circuit board mounted in the frame and having an electronic component to form a desired electric circuit; a plurality of terminals attached to the circuit board and protruding from the frame; and a shielding plate disposed outside the frame, the shielding plate electrically shielding at least one of the terminals and being electrically connected to the frame. The frame is mounted on a motherboard so that an exposed portion of the terminal disposed between the frame and the motherboard is shielded by the shielding plate.

In this case, the shielding plate for electrically shielding any of the terminals protruding from the frame shields the exposed portion of the terminal disposed between the frame and the motherboard. Therefore, it is possible to electrically shield a terminal which is adversely affected by an external wave, to prevent the entry of an interfering wave into the terminal, and to thereby achieve high performance.

Preferably, the at least one of the terminals is an antenna terminal. In particular, a digital broadcasting receiving tuner has a band of 800 MHz, which is equivalent to that of a mobile telephone. Therefore, it is possible to prevent the entry of an interfering wave from the mobile telephone to the antenna terminal, and to enhance the performance of the apparatus.

Preferably, the at least one of the terminals includes an antenna terminal and a ground terminal adjacent to the antenna terminal, and the ground terminal is soldered to the shielding plate. In this case, the antenna terminal is surrounded by the shielding plate that is grounded by being connected to the ground terminal. This reliably prevents the entry of an interfering wave, and ensures high performance.

Preferably, the shielding plate is formed of a resilient metal plate, and includes a flat portion and an elastic wall projecting from the flat portion toward the motherboard. Exposed portions of the antenna terminal and the ground terminal extend through the flat portion, and are surrounded by the elastic wall. The ground terminal is soldered to the flat portion. The elastic wall is in elastic contact with the motherboard when the frame is mounted on the motherboard. In this case, the exposed portions can be reliably shielded between the shielding plate and the motherboard, the entry of an interfering wave can be reliably prevented, and high performance can be achieved. In addition, since the ground terminal is soldered to the flat portion of the shielding plate, soldering to the shielding plate can be performed easily, and allows the shielding plate to be attached easily.

Preferably, the shielding plate is formed of a resilient metal plate, and includes flat portion and an elastic wall projecting from the flat portion toward the frame. Exposed portions of the antenna terminal and the ground terminal are surrounded by the flat portion and the elastic wall. The ground terminal is soldered to the flat portion. The flat portion is in elastic contact with the motherboard when the frame is mounted on the motherboard. In this case, the exposed portions can be reliably shielded between the shielding plate and the frame, the entry of an interfering wave can be reliably prevented, and high performance can be achieved. In addition, since the ground terminal is soldered to the flat portion of the shielding plate, soldering to the shielding plate can be performed easily, and allows the shielding plate to be attached easily.

Preferably, the shielding plate is in contact with a ground pattern provided on the motherboard. This makes grounding of the shielding plate more reliable.

Preferably, the frame includes a bottom wall, a hole provided in the bottom wall so that the terminals extend therethrough, and a pair of legs protruding downward from the bottom wall so as to be attached to the motherboard. The shielding plate includes a projection projecting from the flat portion toward the legs, and an elastic tongue bent from the flat portion toward the bottom wall. The elastic tongue of the shielding plate is in elastic contact with the bottom wall near the hole while the projection is retained by the legs. In this case, the shielding plate can be properly positioned and held relative to the frame, and can be attached stably.

According to the present invention, the shielding plate is provided to electrically shield any of a plurality of terminals protruding outside the frame, and the exposed portion of the terminal between the frame and the motherboard is shielded by the shielding plate. Therefore, especially, the exposed portion of a terminal that is likely to be adversely affected by an external wave can be electrically shielded by the shielding plate, the entry of an interfering wave into the terminal can be prevented, and high performance can be achieved.

DESCRIPTION OF THE PREFERRED EMBODIMENTS

Figure 1:
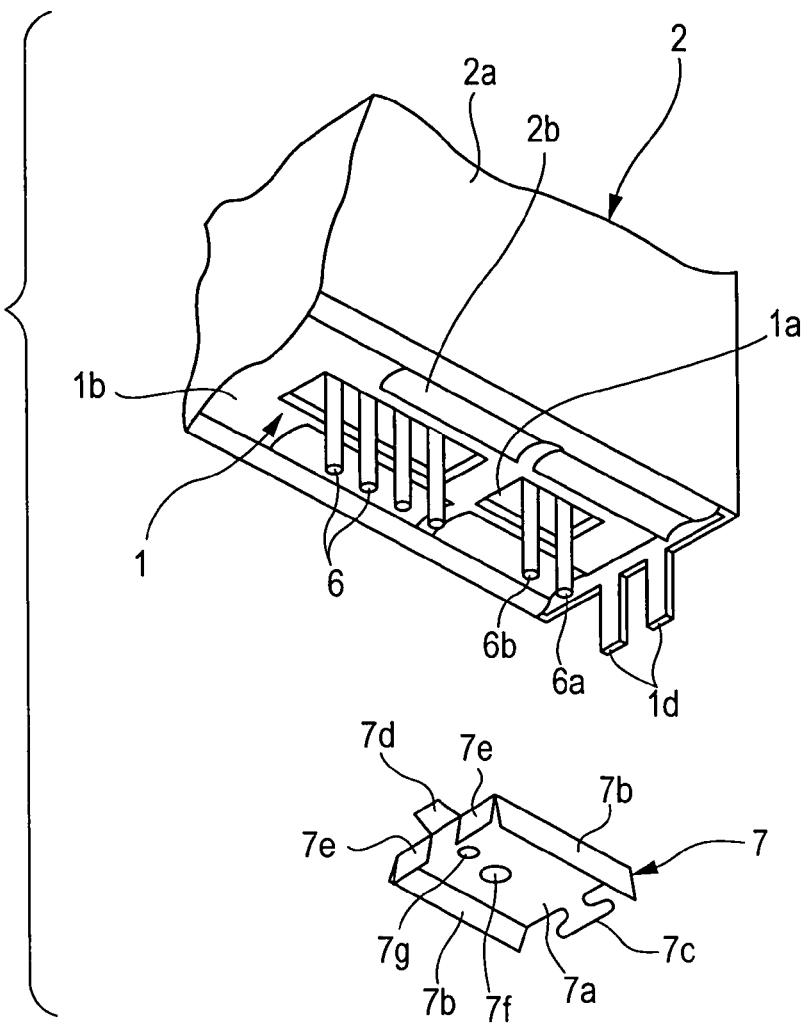
FIG. 1 is an exploded perspective view showing the principal part of a high-frequency apparatus according to a first embodiment of the present invention.

Embodiments of the present invention will be described below with reference to the attached drawings.

FIGS. 1 to 4 show the configuration of a high-frequency apparatus according to a first embodiment of the present invention. The high-frequency apparatus includes a frame 1 formed of a metal plate. The frame 1 is shaped like an open square having opposing openings, and is constituted by a bottom wall 1b having a plurality of holes 1a, a pair of side walls 1c bent upward from two opposing sides of the bottom wall 1b, a pair of legs 1d projecting downward from the side walls 1c below the bottom wall 1b, and a top wall (not shown) provided between the side walls 1c.

The high-frequency apparatus also includes two covers 2 each formed of a metal plate. Each cover 2 includes a flat covering portion 2a, and a resilient clamping portion 2b bent on the periphery of the covering portion 2a so as to clamp the frame 1. The two covers 2 are attached to the frame 1 to form a housing and to electrically shield the interior of the frame 1. In this state, the opposing openings of the frame 1 are closed by the covering portions 2a, and the bottom wall 1b, the side walls 1c, and the top wall of the frame 1 are clamped by the clamping portions 2b.

A circuit board 3 has a wiring pattern 4. Various electronic components 5 are mounted on the wiring pattern 4 to form a desired electric circuit. A plurality of terminals 6 arranged in line are attached to the circuit board 1 such as to be connected to the wiring pattern 4 and to protrude from one side (bottom face) of the circuit board 1. Among the terminals 6, an antenna terminal 6a and a ground terminal 6b are adjacent to each other.

The circuit board 3 having this structure is mounted in the frame 1 by an appropriate means. The terminals 6 attached to the circuit board 3 protrude outside through the holes 1a of the bottom wall 1b. The antenna terminal 6a and the ground terminal 6b protrude through the same one opening 1a.

A shielding plate 7 formed of a resilient metal plate includes a rectangular flat portion 7a, a pair of first elastic walls 7b bent and inclined downward from opposing long sides of the flat portion 7a, a projection 7c projecting from the center of one short side of the flat portion 7a, an elastic tongue 7d inclined upward and projecting from the center of the other short side of the flat portion 7a, a pair of second elastic walls 7e bent and inclined downward from the other short side of the flat portion 7a, and large and small holes 7f and 7g provided in the flat portion 7a.

When the shielding plate 7 is mounted in position, the flat portion 7a faces the bottom wall 1b, an exposed portion of the antenna terminal 6a protrudes downward from the frame 1 through the large hole 7f without contact with the flat portion 7a, an exposed portion of the ground terminal 6b protrudes downward from the frame 1 through the small hole 7g, the projection 7c is retained between the legs 1d, and the elastic tongue 7d is in elastic contact with the bottom wall 1b near the hole 1a.

Figure 2:
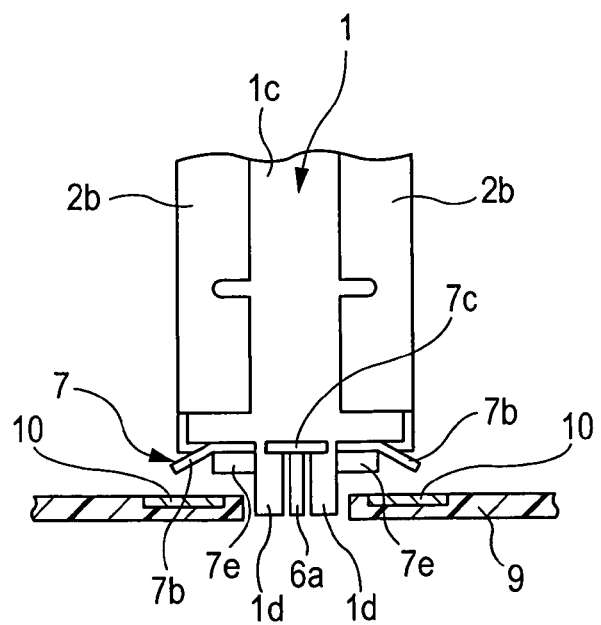
FIG. 2 is a side view of the principal part of the first embodiment.
Figure 3:
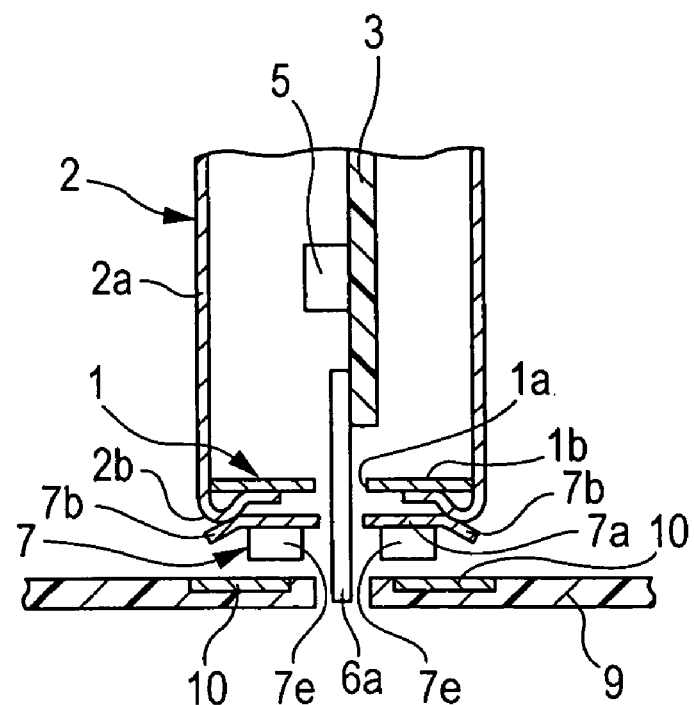
FIG. 3 is a sectional side view of the principal part.
Figure 4:
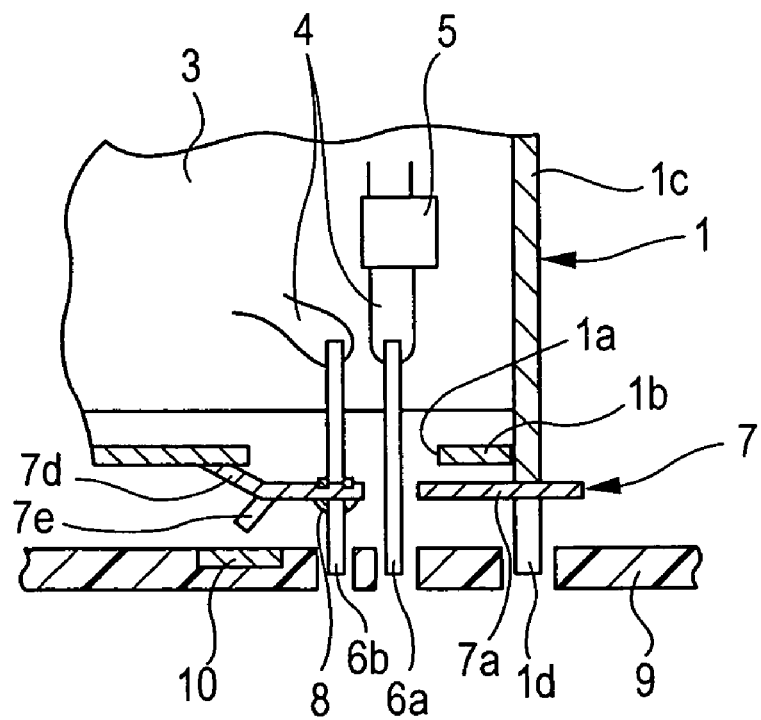
FIG. 4 is a sectional front view of the principal part.

In this case, as shown in FIGS. 2 to 4, the first elastic walls 7b are in elastic contact with the roots of the clamping portions 2b of the covers 2, the projection 7c is in elastic contact with the roots of the legs 1d, and portions of the antenna terminal 6a and the ground terminal 6b other than the exposed leading ends are surrounded by the shielding plate 7. The ground terminal 6b is joined to the flat portion 7a of the shielding plate 7 by solder 8. In this way, the high-frequency apparatus of the first embodiment is constructed.

The high-frequency apparatus having this configuration is applied, for example, to a digital broadcasting receiving tuner for a CATV. As shown in FIGS. 2 to 4, the terminals 6 are fitted in holes (not shown) provided in a motherboard 9, and are soldered to a wiring pattern (not shown) provided on the motherboard 9.

In this case, the shielding plate 7 surrounds the antenna terminal 6a and the ground terminal 6b, and the first and second elastic walls 7b and 7e are in elastic contact with the motherboard 9, so that there is no space between the shielding plate 7 and the motherboard 9. The ground terminal 6b and the shielding plate 7 are grounded by being connected to a ground pattern 10 provided on the motherboard 9.

Figure 5:
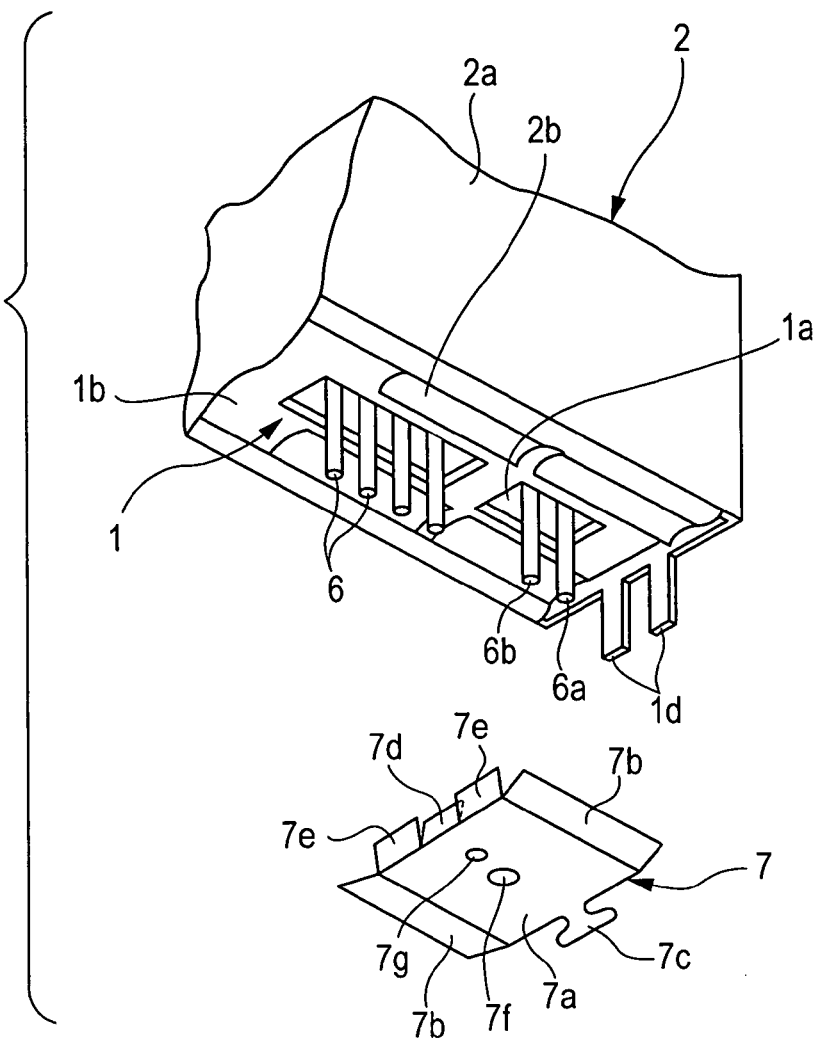
FIG. 5 is an exploded perspective view showing the principal part of a high-frequency apparatus according to a second embodiment of the present invention.
Figure 6:
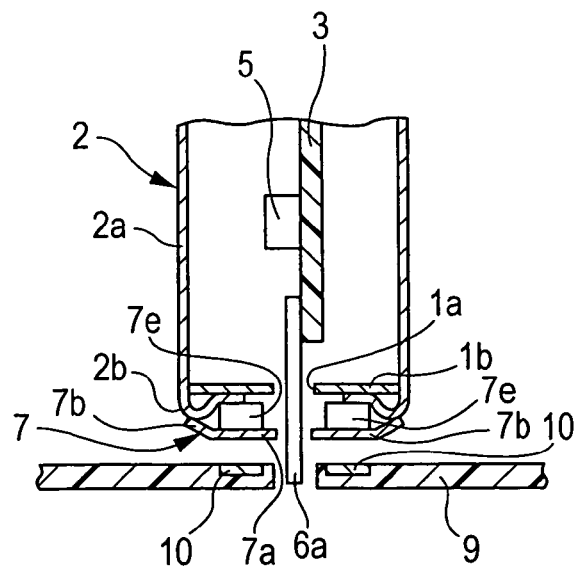
FIG. 6 is a sectional side view of the principal part of the second embodiment.
Figure 7:
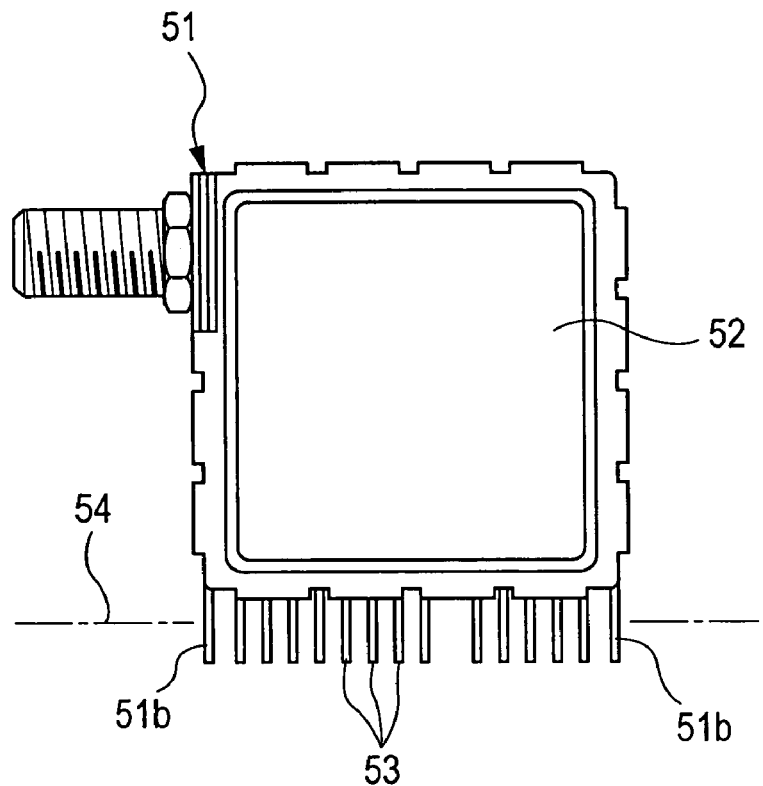
FIG. 7 is a side view of a known high-frequency apparatus.
Figure 8:
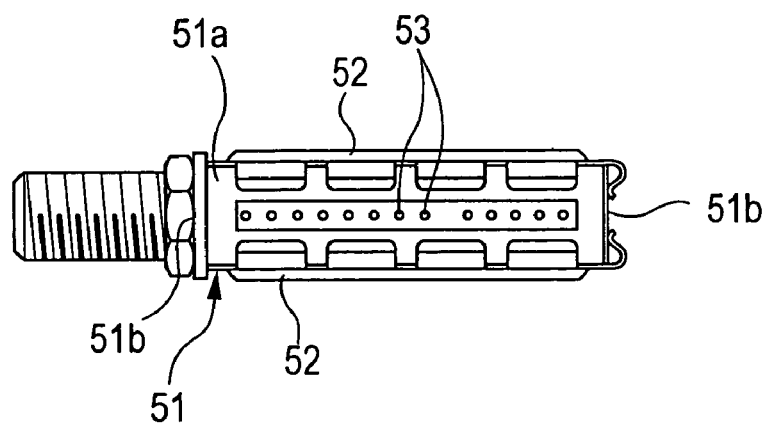
FIG. 8 is a bottom view of the known high-frequency apparatus.

FIGS. 5 and 6 show a high-frequency apparatus according to a second embodiment of the present invention. In the second embodiment, first and second elastic walls 7b and 7e of a shielding plate 7 are bent toward a bottom wall 1b of a frame 1, and are in elastic contact with the frame 1. Exposed portions of an antenna terminal 6a and a ground terminal 6b disposed between the bottom wall 1b and a flat portion 7a of the shielding plate 7 are surrounded by the flat portion 7a and the first and second elastic walls 7b and 7e. The flat portion 7a is pressed by a motherboard 9.

Other structures are similar to those in the first embodiment. Like components are denoted by like reference numerals, and descriptions thereof are omitted.

It should be noted that the shielding plate 7 can have various structures other than the structures in the above-described embodiments.

What is claimed is:

1. A high-frequency apparatus comprising:
a frame formed of a metal plate;
a circuit board mounted in the frame and having an electronic component to form a desired electric circuit;

a plurality of terminals attached to the circuit board and protruding from the frame; and a shielding plate disposed outside the frame, the shielding plate electrically shielding at least one of the terminals and being electrically connected to the frame, wherein the frame is mounted on a motherboard so that an exposed portion of said at least one of the terminals disposed between the frame and the motherboard is shielded by the shielding plate, wherein said at least one of the terminals includes an antenna terminal and a ground terminal adjacent to the antenna terminal, and the ground terminal is soldered to the shielding plate, and wherein the shielding plate is formed of a resilient metal plate, and includes a flat portion and an elastic wall projecting from the flat portion toward the motherboard, wherein exposed portions of the antenna terminal and the ground terminal extend through the flat portion, and are surrounded by the elastic wall, wherein the ground terminal is soldered to the flat portion, and wherein the elastic wall is in elastic contact with the motherboard when the frame is mounted on the motherboard.

2. The high-frequency apparatus according to claim 1, wherein the shielding plate is in contact with a ground pattern provided on the motherboard.

3. The high-frequency apparatus according to claim 1, wherein the frame includes:

a bottom wall;

a hole provided in the bottom wall so that the terminals extend therethrough; and a pair of legs protruding downward from the bottom wall so as to be attached to the motherboard, wherein the shielding plate includes:

a projection projecting from the flat portion toward the legs; and an elastic tongue bent from the flat portion toward the bottom wall, and wherein the elastic tongue of the shielding plate is in elastic contact with the bottom wall near the hole while the projection is retained by the legs.

4. A high-frequency apparatus comprising:

a frame formed of a metal plate;

a circuit board mounted in the frame and having an electronic component to form a desired electric circuit;

a plurality of terminals attached to the circuit board and protruding from the frame; and a shielding plate disposed outside the frame, the shielding plate electrically shielding at least one of the terminals and being electrically connected to the frame, wherein the frame is mounted on a motherboard so that an exposed portion of said at least one of the terminals disposed between the frame and the motherboard is shielded by the shielding plate, wherein said at least one of the terminals includes an antenna terminal and a ground terminal adjacent to the antenna terminal, and the ground terminal is soldered to the shielding plate, and wherein the shielding plate is formed of a resilient metal plate, and includes flat portion and an elastic wall projecting from the flat portion toward the frame, wherein exposed portions of the antenna terminal and the ground terminal are surrounded by a flat portion and the elastic wall, wherein the ground terminal is soldered to the flat portion, and wherein the flat portion is in elastic contact with the motherboard when the frame is mounted on the motherboard.

* * * * *